US008542525B2

(12) United States Patent
Berger et al.

(10) Patent No.: US 8,542,525 B2
(45) Date of Patent: Sep. 24, 2013

(54) MRAM-BASED MEMORY DEVICE WITH ROTATED GATE

(75) Inventors: Neal Berger, Cupertino, CA (US); Mourad El Baraji, Sunnyvale, CA (US)

(73) Assignee: Crocus Technology SA, Grenoble Cedex (FR)

( * ) Notice: Subject to any disclaimer, the term of this patent is extended or adjusted under 35 U.S.C. 154(b) by 247 days.

(21) Appl. No.: 13/038,473

(22) Filed: Mar. 2, 2011

(65) Prior Publication Data

US 2011/0216580 A1    Sep. 8, 2011

(30) Foreign Application Priority Data

Mar. 2, 2010 (EP) .................................... 10290102

(51) Int. Cl.
*G11C 11/00* (2006.01)

(52) U.S. Cl.
USPC ............................ 365/158; 365/161; 365/171

(58) Field of Classification Search
USPC .................... 365/158, 161, 171, 173, 189.01, 365/189.04, 189.07, 209, 185.29, 185.18, 365/185.05, 185.11
See application file for complete search history.

(56) References Cited

U.S. PATENT DOCUMENTS

| 7,369,629 | B2 * | 5/2008 | Umewaka | 375/334 |
| 2005/0122768 | A1 * | 6/2005 | Fukumoto | 365/158 |
| 2009/0316476 | A1 | 12/2009 | Javerliac et al. | |
| 2010/0061148 | A1 * | 3/2010 | Komatsu | 365/185.03 |

FOREIGN PATENT DOCUMENTS

WO    2005/043545 A1    5/2005

OTHER PUBLICATIONS

European Search Report for application EP 10290102 dated Oct. 13, 2010.

* cited by examiner

*Primary Examiner* — Dang Nguyen
(74) *Attorney, Agent, or Firm* — Pearne & Gordon LLP

(57) ABSTRACT

A memory device comprising: a plurality of magnetoresistive random access memory (MRAM) cells arranged in rows and columns, each MRAM cell comprising a magnetic tunnel junction and a select transistor, one end of the magnetic tunnel junction being electrically coupled to the source of the select transistor; a plurality of word lines, each word line connecting MRAM cells along a row via the gate of their select transistor; a plurality of bit lines, each bit line connecting MRAM cells along a column, each bit line connecting the MRAM cells via the drain of their select transistor; wherein the memory device further comprises a plurality of source lines, each source line connecting MRAM cells along a row; and wherein each source line connecting the MRAM cells via the other end of the magnetic tunnel junction.

15 Claims, 4 Drawing Sheets

MRAM-BASED MEMORY DEVICE WITH ROTATED GATE

FIELD

The present disclosure generally relates to a memory device comprising a plurality of selectable magnetoresistive random access memory (MRAM) cells. More particularly, the present disclosure concerns an arrangement of the memory device in order to minimize the size of the MRAM cells and decrease power consumption of the memory device.

BACKGROUND

FIGS. 1a and 1b illustrate an equivalent circuit of a conventional memory device formed from an array comprising a plurality of thermally assisted switching magnetic random access memory (TAS-MRAM) cells 1. Four such TAS-MRAM cells 1 are represented in FIGS. 1a and 1b.

Each TAS-MRAM cell 1 comprises a magnetic tunnel junction represented by the numeral 2 in FIGS. 1a and 1b, and a select transistor 3, electrically connected to the magnetic tunnel junction 2. Although not represented in the FIGS. 1a and 1b, the magnetic tunnel junction 2 can be formed of a reference layer having a fixed magnetization, a storage layer having a direction that can be switched from a first stable direction to a second stable direction upon writing of the cell, and an insulating layer between the storage layer and the sense layer. The magnetic tunnel junction 2 can further comprise a first antiferromagnetic layer (not shown) pinning the magnetization of the reference layer and providing the fixed magnetization of the reference layer and a second antiferromagnetic layer (also not shown) pinning the storage layer when the magnetic tunnel junction 2 is at a temperature that is below a critical temperature of the second antiferromagnetic layer.

The array comprises a plurality of bit lines BL and a word lines WL, each bit line BL and each word line WL addressing a row and a column of the array, respectively. More particularly, the bit lines BL and word lines WL are electrically connected to the drain and gate of the select transistor 3, respectively. In the arrangement of FIGS. 1a and 1b, the source of the select transistors 3 are grounded through a plurality of source lines SL connected to rows of TAS-MRAM cells 1 of the array.

During a write operation (FIG. 1a) one of the TAS-MRAM cells 1 is selectively written by supplying a maximum voltage $Vdd_{BL}$ to one of the bit lines BL, and supplying a maximum voltage $Vdd_{WL}$ to one of the word lines WL. The selected TAS-MRAM cell 1, lying at the intersection of the activated bit line BL and word line WL, is shown encircled in FIG. 1a. The respective values of $Vdd_{BL}$ and $Vdd_{WL}$ are determined by the specifications of the select transistor 3.

More particularly, during the write operation, the select transistor 3 of the selected TAS-MRAM cell 1 is in a passing mode by applying the voltage $Vdd_{WL}$ to its gate, via the word line WL. The voltage $Vdd_{BL}$ applied on the bit line BL results in a voltage of $V_{DS}=Vdd-Vmtj$ at the drain of the select transistor 3, where Vmtj is the write bias voltage across the magnetic tunnel junction 2. The write bias voltage Vmtj must be high enough to pass a heating current 31 through the magnetic tunnel junction 2 capable of heating the TAS-MRAM cell 1 above the critical temperature of the antiferromagnetic layer in order to free the magnetization of the storage layer. During heating of the TAS-MRAM cell 1, means of switching the magnetization of the storage layer are applied.

Means of switching can comprise a magnetic field generated by a field current (not shown) passing through field lines (also not represented). Means of switching can also comprise passing a spin transfer torque current (not shown) through the magnetic tunnel junction 2, via the activated bit line BL, the storage layer magnetization being then switched by the so-called spin transfer torque (STT) effect.

After the storage layer magnetization has been switched, the select transistor 3 can be set in a blocked mode by deselecting the activated word line WL or bit line BL, causing the magnetic tunnel junction 2 to cool down below the critical temperature, where the storage layer magnetization is "frozen" in the written direction.

During a read operation represented in FIG. 1b, the select transistor 3 of the selected TAS-MRAM cell 1 (shown encircled in FIG. 1b) is set in a passing mode by applying a voltage $V_{DD}$ to its gate, via the word line WL. A relatively low read bias voltage $V_R$, of about 300 mV, is applied to the magnetic tunnel junction 2, via the bit line BL, in order to pass a sense current 32 through the magnetic tunnel junction 2. The sense current 32 allows for measuring a junction resistance R of the magnetic tunnel junction 2, which value corresponds to the written direction of the reference layer magnetization relative to the magnetization of the reference layer.

During the write operation, the write bias voltage $V_{mtj}$ is typically equal or greater than 1 V, its value being primarily limited by the breakdown voltage of the magnetic tunnel junction 2. When sinking the corresponding heating current 31, the select transistor 3 operates in its linear region. Since the select transistor 3 is operating below its saturation region, sinking the large heating current 31 requires the select transistor 3 to have a large size. Consequently, the size of the TAS-MRAM cell 1 becomes dominated by the size of the select transistor 3.

SUMMARY

The present application discloses a memory device which overcomes at least some limitations of the prior art.

According to the embodiments, a memory device comprising a plurality of magnetoresistive random access memory (MRAM) cells arranged in rows and columns, each MRAM cell comprising a magnetic tunnel junction and a select transistor, one end of the magnetic tunnel junction being electrically coupled to the source of the select transistor; a plurality of word lines, each word line connecting MRAM cells along a row via the gate of their select transistor; a plurality of bit lines, each bit line connecting MRAM cells along a column, each bit line connecting the MRAM cells via the drain of their select transistor; wherein the memory device further comprises a plurality of source lines, each source line connecting MRAM cells along a row; and wherein each source line connecting the MRAM cells via the other end of the magnetic tunnel junction.

In an embodiment, the select transistor is a high-power, low threshold voltage transistor.

In another embodiment, the magnetic tunnel junction of each MRAM cell further comprises a reference layer having a fixed magnetization, a storage layer having a second magnetization switchable from a first stable direction to a second stable direction, and an insulating layer between the storage layer and the sense layer.

In yet another embodiment, the magnetic tunnel junction further comprises a first antiferromagnetic layer pinning the magnetization of the reference layer and a second antiferromagnetic layer pinning the storage layer when the magnetic tunnel junction is at a temperature that is below a high threshold temperature.

The present application also pertains to a method of writing a memory device comprising:

selectively writing one of the TAS-MRAM cells by applying a word write bias voltage and a source write bias voltage, respectively to the word line and source line connected to the selected TAS-MRAM cells, and grounding the bit line connected to the selected TAS-MRAM cells; and unselecting TAS-MRAM cells being in the same row as the TAS-MRAM cell being selectively written by applying via the corresponding bit line a bit bias voltage having a value corresponding substantially to the word write bias voltage, and unselecting other TAS-MRAM cells by grounding the corresponding word lines.

In an embodiment, the source write bias voltage of the source line connected to the selected TAS-MRAM cells has a value that is higher than the word write bias voltage of the word line connected to the selected TAS-MRAM cells such as to pass a heating current through the magnetic tunnel junction of the MRAM cell being selectively written.

In another embodiment, the source write bias voltage has a value corresponding to $V_{DD}$ plus the write bias junction voltage across the magnetic tunnel junction when passing the heating current.

In yet another embodiment, the magnitude of the heating current corresponds substantially to the magnitude of the saturation drain current of the select transistor.

In yet another embodiment, prior unselecting TAS-MRAM cells, the method further comprises switching the magnetization of the storage layer.

In yet another embodiment, said switching the magnetization of the storage layer comprises a magnetic field generated by passing a field current in the bit line addressing said one of the TAS-MRAM cells.

In yet another embodiment, said switching the magnetization of the storage layer comprises passing a spin-polarized current through the magnetic tunnel junction of said one of the TAS-MRAM cells, via the bit line addressing said one of the TAS-MRAM cells.

Also disclosed is a method of reading a memory device comprising:

selectively reading one of the TAS-MRAM cells by applying a word read bias voltage via the word line to the gate of the select transistor connected to the selected TAS-MRAM cells, and applying a bit read bias voltage and a source read bias voltage to the bit line and source line addressing the selected TAS-MRAM cell; and unselecting TAS-MRAM cells being in the same row as the TAS-MRAM cell being selectively read by applying, via the corresponding bit lines, a bit bias voltage having a value corresponding to the source read bias voltage, and unselecting other TAS-MRAM cells by grounding the corresponding word lines.

In an embodiment, the word read bias voltage of the word line connected to the selected TAS-MRAM cells is higher than the source read bias voltage, such as to generate a sense voltage and pass a sense current through the magnetic tunnel junction of the selected TAS-MRAM cell.

In another embodiment, the word read bias voltage is such that the select transistor is operated in its linear region.

In yet another embodiment, the sense voltage is 300 mV.

The memory device disclosed herein allows for using select transistors with smaller size than the ones used in conventional memory devices, hence, decreasing the overall size of the memory device. Memory devices having high density and low power consumption can then be achieved.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS OF THE INVENTION

Figure 1A:
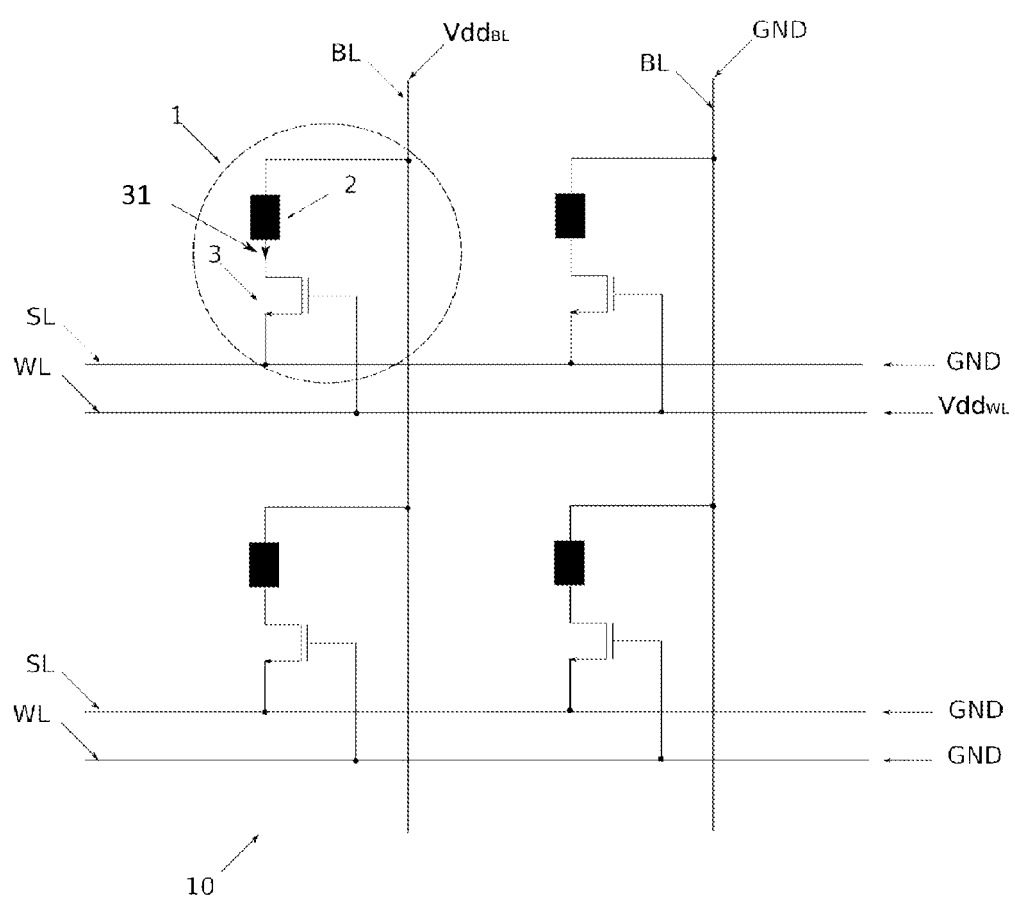
FIG. 1a illustrates an equivalent circuit of a conventional memory device during a write operation.
Figure 1B:
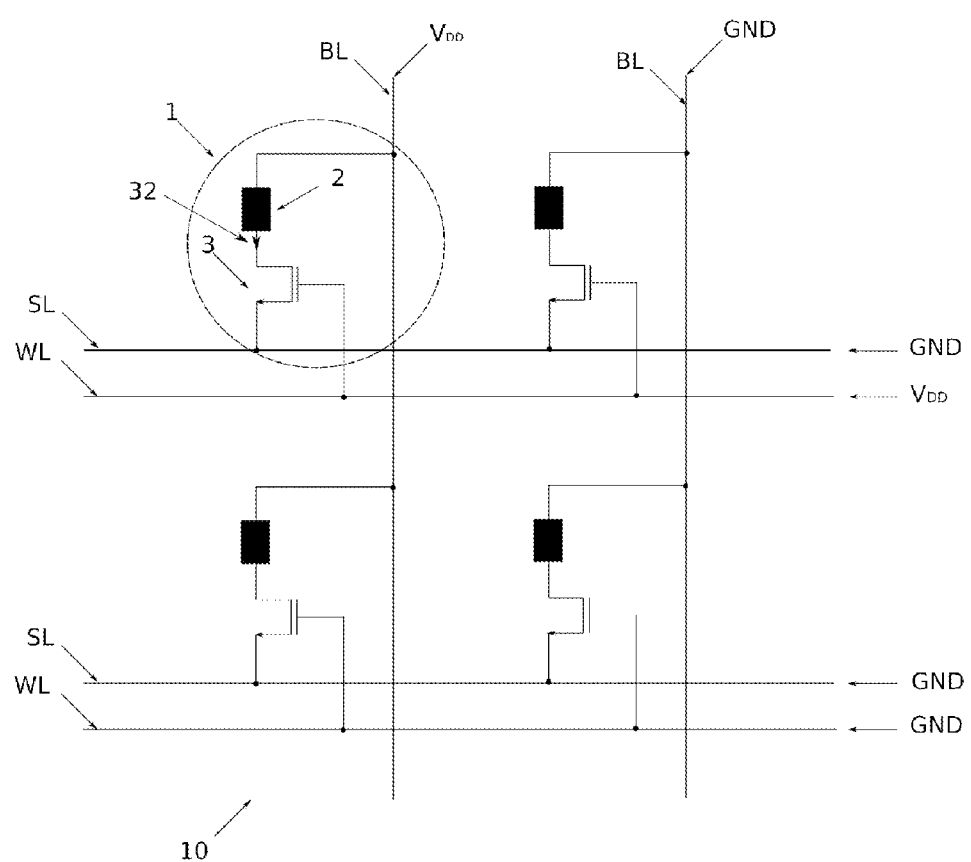
FIG. 1b illustrates an equivalent circuit of a conventional memory device during a read operation.
Figure 2A:
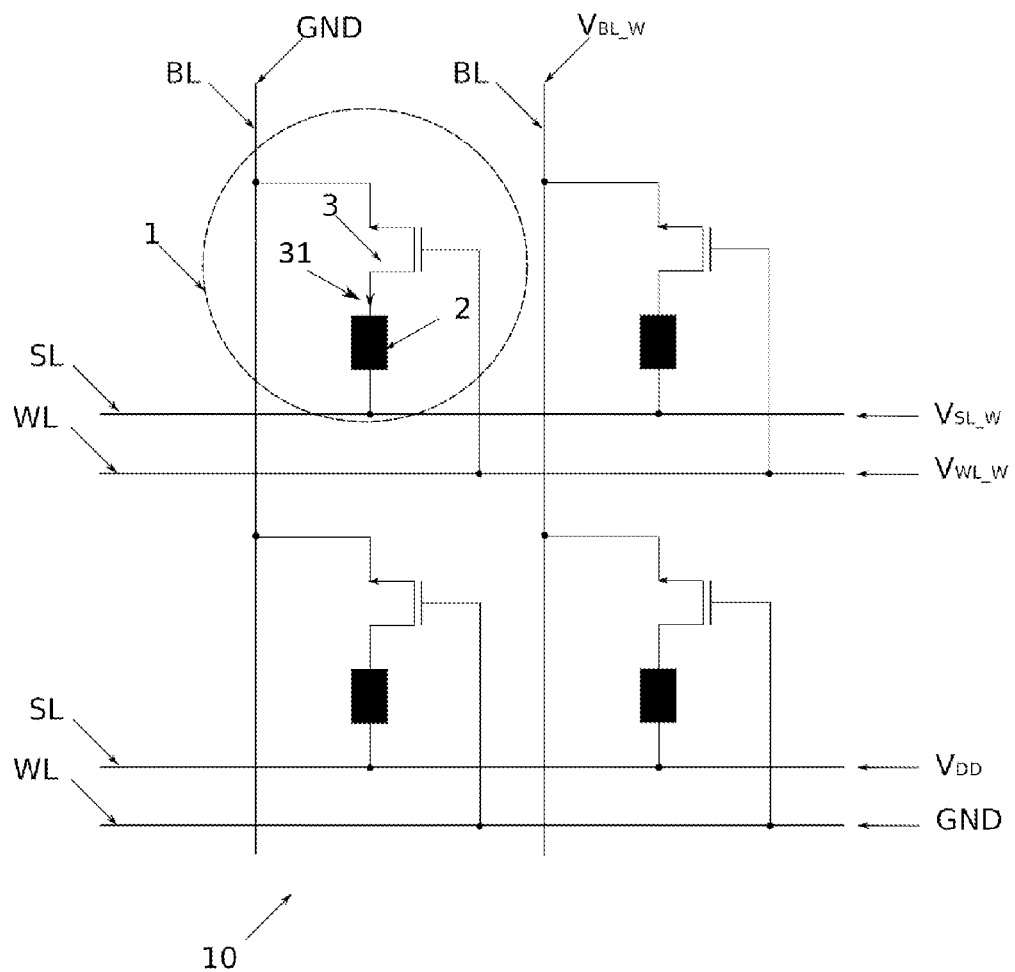
FIG. 2a represents an equivalent circuit of a memory device during a write operation according to an embodiment.
Figure 2B:
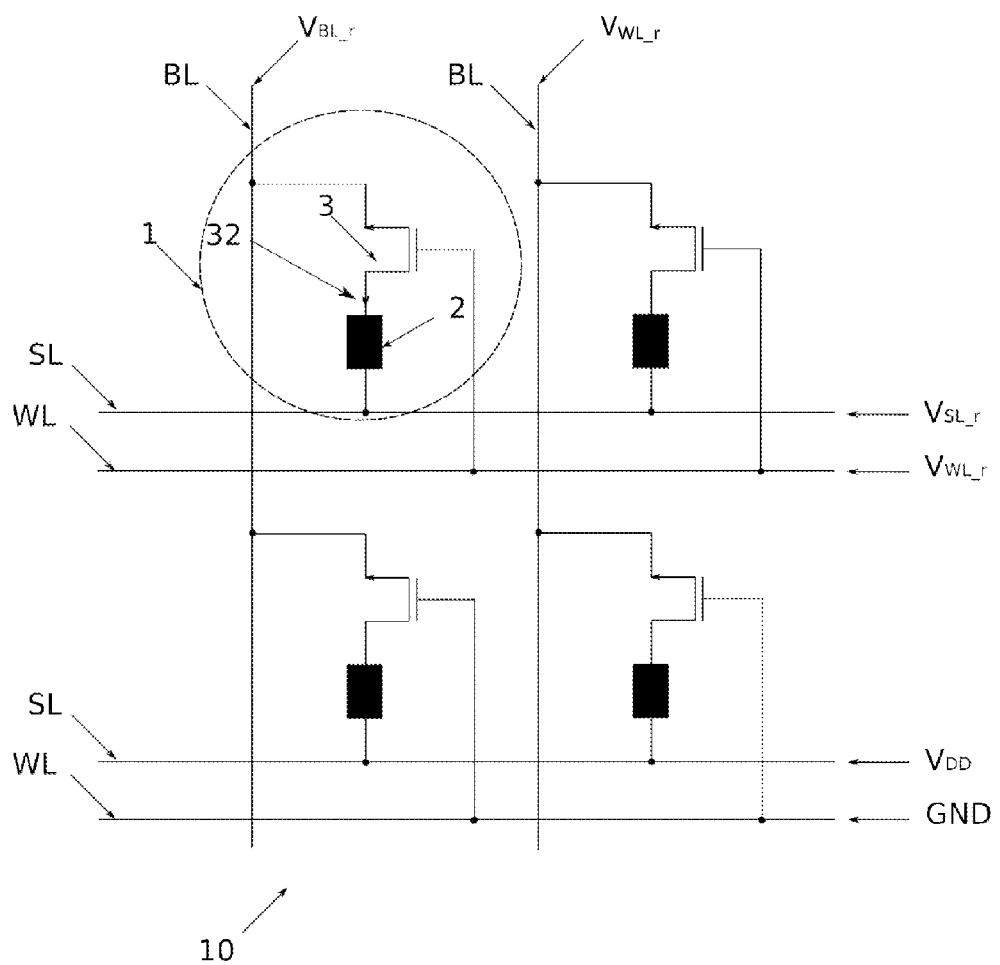
FIG. 2b represents an equivalent circuit of a memory device during a read operation according to an embodiment.

FIGS. 2a and 2b represent an equivalent circuit of a memory device 10 formed from an array comprising a plurality of thermally assisted switching magnetoresistive random access memory (TAS-MRAM) cells 1 arranged in a plurality of rows and columns, according to an embodiment. In FIGS. 2a and 2b, only four TAS-MRAM cells 1 are shown. Each TAS-MRAM cell 1 comprises a magnetic tunnel junction 2 and a select transistor 3 electrically coupled to the magnetic tunnel junction 2. The memory device 10 further comprises a plurality of bit lines BL and select lines SL, orthogonal with the bit lines BL. Each bit line BL connect TAS-MRAM cells 1 along a column via the source of their respective select transistor 3, and each select line SL connecting TAS-MRAM cells 1 along a row via their respective magnetic tunnel junction 2. In the example of FIGS. 2a and 2b, the memory device 10 further comprises a plurality of word lines WL, parallel to the select lines SL, and connecting MRAM cells 1 along a columns via the gate of their respective select transistor 3.

In an embodiment not represented, the magnetic tunnel junction 2 can be formed from a reference layer having a fixed magnetization, a storage layer having a magnetization that can be switched from a first stable direction to a second stable direction, and an insulating layer between the reference and storage layers. The magnetic tunnel junction 2 can further comprise a first antiferromagnetic layer pinning the magnetization of the reference layer and providing its fixed magnetization, and a second antiferromagnetic layer pinning the storage layer when the magnetic tunnel junction 2 is at a temperature that is below a high threshold temperature of the second antiferromagnetic layer.

During a write operation, one of the TAS-MRAM cells 1 can be selectively written by addressing the corresponding word, bit and source lines WL, BL, SL with appropriate voltage values. In FIG. 2a, the memory cell 1 is represented where the one TAS-MRAM cell 1 being written, or selected, is shown encircled. More particularly, during a write operation a word write bias voltage $V_{WL\_w}$ and a source write bias voltage $V_{SL\_w}$ are applied, respectively to the word line WL and source line SL connected to the selected TAS-MRAM cell 1. The word write bias voltage $V_{WL\_w}$ set the select transistor 3 of the selected TAS-MRAM cell 1 in a passing mode. The bit line BL connected to the selected TAS-MRAM cell 1 is grounded (GND).

In an embodiment, the source write bias voltage $V_{SL\_w}$ has a value that is higher than the word write bias voltage $V_{WL\_w}$, such as to pass a drain current 31 through the magnetic tunnel junction 2 of the selected TAS-MRAM cell 1. The values of the source write bias voltage $V_{SL\_w}$ and the word write bias voltage $V_{WL\_w}$ can be such that the magnitude of the drain current 31 corresponds substantially to the magnitude of the saturation drain current of the select transistor 3. Preferably, the source write bias voltage $V_{SL\_w}$ is higher than the transistor saturation drain voltage $V_{Dsat}$ by a value of $V_{mtj\_w}$, corresponding to the write bias junction voltage across the magnetic tunnel junction 2 when passing the drain current 31. It may be convenient to set the value of $V_{WL\_w}$ to $V_{DD}$ and $V_{SL\_w}$ to a value corresponding to $V_{DD}+V_{mtj\_w}$, as far as such voltage value is compatible with foundry design rules for gate oxide, or specifications of the select transistor 3, in order to avoid damaging the select transistor gate oxide.

In an embodiment, the drain current is used as a heating current 31 for heating the magnetic tunnel junction 2 of the selected TAS-MRAM cell 1 above the high threshold temperature, in order to free the magnetization of the corresponding storage layer. In the case the select transistor 3 is biased at its saturation voltage, the heating current 31 corresponds to the saturation drain current of the select transistor 3, allowing the size of the select transistor 3 required for sourcing the heating current 31 to be minimized.

During the write operation, the storage layer magnetization of the heated magnetic tunnel junction 2 is switched by switching means comprising a magnetic field, generated by passing a field current (not shown) through the bit line BL addressing the selected TAS-MRAM cell 1 or through separate field lines (not shown). Switching means can also comprise passing a spin-polarized current (not shown) through the heated magnetic tunnel junction 2 of the selected TAS-MRAM cell 1, via the corresponding addressing bit line BL. In the latter case, the magnetization of the storage layer is switched by the so-called spin transfer torque (STT) effect.

In an embodiment, the other TAS-MRAM cells 1 being connected to the activated source line SL, or in the same row as the selected TAS-MRAM cell 1 (the TAS-MRAM cell 1 at the right of the selected one in FIG. 2a), are unselected (or not being written) by applying, via the corresponding bit line BL, a bit bias voltage $V_{BL\_w}$, having a value corresponding substantially to the word write bias voltage $V_{WL\_w}$, such that the difference between the values of $V_{BL\_w}$ and $V_{WL\_w}$ is null, or at least low enough to cut off any significant leakage current of the corresponding select transistors 3.

The other TAS-MRAM cells 1 on the other rows (the two lower TAS-MRAM cells on FIG. 2a) can be unselected by grounding (GND) the word lines WL addressing them, setting the select transistor 3 in a blocked mode. In the example of FIG. 2a, the corresponding source lines SL are set to a bias voltage of $V_{DD}$ or is floating (float).

The bit lines BL addressing the unselected TAS-MRAM cells 1 being set at the bit bias voltage $V_{BL\_w}$ are reverse body biased (backbiased) with the high (source-substrate) source write bias voltage $V_{SL\_w}$. Consequently, very low sub-threshold leakage of the corresponding select transistors 3 due to body effect can be achieved. This allows using high-power, low threshold voltage (low VT) transistors as select transistor 3. Moreover, the low VT transistors have a saturation current that is typically 20% higher than the one of conventional transistors, and are optimized for high currents. Consequently, the size of the select transistor 3 can be reduced, hence reducing the size of the memory device 10.

Due to cut off in leakage current, lower power consumption can be achieved with the memory device according to the embodiments compared to the conventional memory devices. The smaller select transistor size also allows for minimizing variations in the select transistor current due to smaller parasitic currents than the ones occurring in larger memory arrays.

During a read operation (see FIG. 2b), one of the TAS-MRAM cells 1 (shown encircled in FIG. 2b) can be selectively read by addressing the gate of its select transistor 3 with a word read bias voltage $V_{WL\_r}$ via the corresponding word line WL, setting the transistor 3 in a passing mode. A bit read bias voltage $V_{BL\_r}$ and a source read bias voltage $V_{SL\_r}$ are applied respectively to the bit line BL and source line SL addressing the selected TAS-MRAM cell 1.

In an embodiment, the word read bias voltage $V_{WL\_r}$ is higher than the source read bias voltage $V_{SL\_r}$, such as to generate a sense voltage $V_{sense}$ and pass a sense current 32 through the magnetic tunnel junction 2 of the selected MRAM cell 1. The bit read bias voltage $V_{BL\_r}$ then has a value corresponding to the source read bias voltage $V_{SL\_r}$ minus the sense voltage $V_{sense}$, minus the voltage drop $V_{Drop}$ of the select transistor 3. Here, $V_{Drop}$ corresponds to the $V_{DS}$ drop across the transistor. The sense current 32 flowing through the magnetic tunnel junction 2, via the bit line BL, can then be sensed to determine the junction resistance R of the magnetic tunnel junction 2, using a conventional current sensing technique. The value of the determined junction resistance R corresponds to the written direction of the storage layer magnetization relative to the magnetization of the reference layer. Alternatively, the junction resistance R can be determined using a voltage sensing technique.

In order to sense the selected TAS-MRAM cell 1 in a reliable and robust manner, it is preferred that the select transistor 3 be operated in its linear region where the small-signal resistance of the TAS-MRAM cell 1 is low enough to allow sensing of the magnetoresistance change in the magnetic tunnel junction 2 in series with the select transistor 3. This can be achieved by applying to the gate of the select transistor 3 of the selected TAS-MRAM cell 1 the word read bias voltage $V_{WL\_r}$ having a value as high as is practical for the circuit design. However, the word read bias voltage $V_{WL\_r}$ must not be so high to damage the gate oxide of the select transistor 3, and/or impair the long-term reliability of the TAS-MRAM cell 1. For example, the word read bias voltage $V_{WL\_r}$ can have a value of $V_{DD}+$, where $V_{DD}+$ corresponds to $V_{DD}+\Delta V$, $\Delta V$ being an extra voltage generating the sense voltage $V_{sense}$ such that the sense current 32 is large enough for sensing.

In a preferred embodiment, the sense voltage $V_{sense}$ has a value of about 300 mV, yielding a high magnetoresistance and avoiding significant heating of the magnetic tunnel junction 2.

In an embodiment, the other TAS-MRAM cells 1 being connected to the activated source line SL, or in the same row as the selected TAS-MRAM cell 1 (the TAS-MRAM cell 1 at the right of the selected one in FIG. 2b), are unselected (or not being read) by applying, via the corresponding bit lines BL, a bit bias voltage $V_{BL\_r}$ having a value corresponding to the word read bias voltage $V_{WL\_r}$ (such that the difference between the values of $V_{BL\_r}$ and $V_{WL\_r}$ is null).

The other TAS-MRAM cells 1 on the other rows (the two lower TAS-MRAM cells on FIG. 2b) can be unselected by grounding (GND) the word lines WL addressing them, setting the select transistor 3 in a blocked mode. In the example of FIG. 2b, the corresponding source lines SL are set to a bias voltage of $V_{DD}$ or is floating (float).

For convenience and in order to minimize power consumption of the memory device 1, the bit write bias voltage $V_{BL\_w}$ applied to the selected bit line BL and the bit read bias voltage $V_{BL\_r}$ applied to the deselected bit line BL during the write and read operations, respectively, can have the same value.

The source write bias voltage $V_{SL\_w}$ and the source read bias voltage $V_{SL\_r}$ will in turn bias the selected source line SL through the magnetic tunnel junctions 2 of the unselected TAS-MRAM cells 1 connected to the same selected source line SL.

TABLE 1

| | Bit line BL | | Word line WL | | Source line SL | |
|---|---|---|---|---|---|---|
| | selected | unselected | selected | unselected | selected | unselected |
| write | GND | $V_{BL-w} = V_{WL\_w}$ | $V_{WL-w} \geq V_{DD}$ | GND | $V_{SL-w} = V_{DD} + V_{mtj\_w}$ | $V_{SL-w} = V_{DD}$ or float |
| read | $V_{BL-r} = V_{SL\_r} - V_{sense} - V_{drop}$ | $V_{BL-r} = V_{WL\_r}$ | $V_{WL-r} = V_{DD+}$ | GND | $V_{SL\_r} = V_{DD}$ | $V_{SL\_r} = V_{DD}$ or float |

Table 1 summarizes the different values of the bit, source and word bias voltages applied to the bit, word and source lines BL, WL, SL during the write and read operations for the selected and unselected lines, respectively.

The disclosure is susceptible to various modifications and alternative forms, and specific examples thereof have been shown by way of example in the drawings and are herein described in detail. It should be understood, however, that the disclosure is not to be limited to the particular forms or methods disclosed, but to the contrary, the disclosure is to cover all modifications, equivalents, and alternatives.

For example, the memory device arrangement according to the embodiments can be used for any type of MRAM cells where maximizing the current density is desirable, such as STT, etc., and in not limited to TAS-MRAM cells.

| Reference Numbers and Symbols | |
|---|---|
| 1 | TAS-MRAM cell |
| 10 | memory device |
| 2 | magnetic tunnel junction |
| 3 | select transistor |
| 31 | heating current |
| 32 | sense current |
| BL | bit line |
| R | junction resistance |
| SL | source line |
| $V_{BL\_w}$ | bit bias voltage in the write operation |
| $V_{BL\_r}$ | bit bias voltage in the read operation |
| $V_{DD}$ | voltage |
| $V_{DD+}$ | voltage $V_{DD} + \Delta V$ |
| $V_{drop}$ | voltage drop of the select transistor |
| $V_{mtj\_w}$ | write bias junction voltage across the magnetic tunnel junction |
| $V_{sense}$ | sense voltage |
| $V_{SL\_r}$ | source read bias voltage |
| $V_{SL\_w}$ | source write bias voltage |
| $V_{WL\_r}$ | word read bias voltage |
| $V_{WL\_w}$ | word write bias voltage |
| WL | word line |

The invention claimed is:

1. A memory device comprising:
   a plurality of magnetoresistive random access memory (MRAM) cells arranged in rows and columns, each MRAM cell comprising a magnetic tunnel junction and a select transistor, one end of the magnetic tunnel junction being electrically coupled to the source of the select transistor;
   a plurality of word lines, each word line connecting MRAM cells along a row via the gate of their select transistor;
   a plurality of bit lines, each bit line connecting MRAM cells along a column, each bit line connecting the MRAM cells via the drain of their select transistor; wherein
   the memory device further comprises a plurality of source lines, each source line connecting MRAM cells along a row; and wherein
   each source line connecting the MRAM cells via the other end of the magnetic tunnel junction, wherein
   either a word write bias voltage and a source write bias voltage, is applied respectively to the word line and source line connected to a selected MRAM cell, and the bit line connected to the selected MRAM cells is grounded, and a bit bias voltage is applied to bit lines connected to other MRAM cells in the same row as the selected MRAM cell, the bit bias voltage having a value corresponding substantially to the word write bias voltage, and the word lines connected to remaining MRAM cells are grounded, or
   a word read bias voltage is applied via the word line to the gate of the select transistor connected to the selected MRAM cell, and a bit read bias voltage and a source read bias voltage is applied to the bit line and source line connected to the selected MRAM cell, and a bit bias voltage having a value corresponding to the source read bias voltage is applied to bit lines connected to other MRAM cells in the same row as the selected MRAM cell, and the word lines connected to remaining MRAM are grounded.

2. The memory device according to claim 1, wherein the select transistor is a high-power, low threshold voltage transistor.

3. The memory device according to claim 1, wherein the magnetic tunnel junction of each MRAM cell further comprises a reference layer having a fixed magnetization, a storage layer having a second magnetization switchable from a first stable direction to a second stable direction, and an insulating layer between the storage layer and the sense layer.

4. The memory device according to claim 3, wherein the magnetic tunnel junction further comprises a first antiferromagnetic layer pinning the magnetization of the reference layer and a second antiferromagnetic layer pinning the storage layer when the magnetic tunnel junction is at a temperature that is below a high threshold temperature.

5. Method of writing a memory device comprising:
   a plurality of magnetoresistive random access memory (MRAM) cells arranged in rows and columns, each MRAM cell comprising a magnetic tunnel junction and a select transistor, one end of the magnetic tunnel junction being electrically coupled to the source of the select transistor;

a plurality of word lines, each word line connecting MRAM cells along a row via the gate of their select transistor;

a plurality of bit lines, each bit line connecting MRAM cells along a column, each bit line connecting the MRAM cells via the drain of their select transistor;

a plurality of source lines, each source line connecting MRAM cells along a row via the other end of the magnetic tunnel junction; the method comprising:

selectively writing one of the thermally assisted switching magnetic random access memory cells by applying a word write bias voltage and a source write bias voltage, respectively to the word line and source line connected to the selected thermally assisted switching magnetic random access memory cells, and grounding the bit line connected to the selected thermally assisted switching magnetic random access memory cells; and unselecting thermally assisted switching magnetic random access memory cells being in the same row as the thermally assisted switching magnetic random access memory cell being selectively written by applying via the corresponding bit line a bit bias voltage having a value corresponding substantially to the word write bias voltage, and unselecting other thermally assisted switching magnetic random access memory cells by grounding the corresponding word lines.

6. The method according to claim 5, wherein the source write bias voltage of the source line connected to the selected thermally assisted switching magnetic random access memory cells has a value that is higher than the word write bias voltage of the word line connected to the selected thermally assisted switching magnetic random access memory cells such as to pass a heating current through the magnetic tunnel junction of the MRAM cell being selectively written.

7. The method according to claim 6, wherein the source write bias voltage has a value corresponding to $V_{DD}$ plus the write bias junction voltage across the magnetic tunnel junction when passing the heating current.

8. The method according to claim 6, wherein the magnitude of the heating current corresponds substantially to the magnitude of the saturation drain current of the select transistor.

9. The method according to claims from 6, wherein the magnetic tunnel junction of each MRAM cell comprises a reference layer having a fixed magnetization, a storage layer having a second magnetization switchable from a first stable direction to a second stable direction, and an insulating layer between the storage layer and the sense layer; and wherein prior unselecting thermally assisted switching magnetic random access memory cells, the method further comprises switching the magnetization of the storage layer.

10. The method according to claim 9, wherein said switching the magnetization of the storage layer comprises a magnetic field generated by passing a field current in the bit line addressing said one of the thermally assisted switching magnetic random access memory cells.

11. The method according to claim 9, wherein said switching the magnetization of the storage layer comprises passing a spin-polarized current through the magnetic tunnel junction of said one of the thermally assisted switching magnetic random access memory cells, via the bit line addressing said one of the thermally assisted switching magnetic random access memory cells.

12. Method of reading a memory device comprising:

a plurality of magnetoresistive random access memory (MRAM) cells arranged in rows and columns, each MRAM cell comprising a magnetic tunnel junction and a select transistor, one end of the magnetic tunnel junction being electrically coupled to the source of the select transistor;

a plurality of word lines, each word line connecting MRAM cells along a row via the gate of their select transistor;

a plurality of bit lines, each bit line connecting MRAM cells along a column, each bit line connecting the MRAM cells via the drain of their select transistor;

a plurality of source lines, each source line connecting MRAM cells along a row via the other end of the magnetic tunnel junction; the method comprising:

selectively reading one of the thermally assisted switching magnetic random access memory cells by applying a word read bias voltage via the word line to the gate of the select transistor connected to the selected thermally assisted switching magnetic random access memory cells, and applying a bit read bias voltage and a source read bias voltage to the bit line and source line addressing the selected thermally assisted switching magnetic random access memory cell; and unselecting thermally assisted switching magnetic random access memory cells being in the same row as the thermally assisted switching magnetic random access memory cell being selectively read by applying, via the corresponding bit lines, a bit bias voltage having a value corresponding to the source read bias voltage, and unselecting other thermally assisted switching magnetic random access memory cells by grounding the corresponding word lines.

13. The method according to claim from 12, wherein the word read bias voltage of the word line connected to the selected thermally assisted switching magnetic random access memory cells is higher than the source read bias voltage, such as to generate a sense voltage and pass a sense current through the magnetic tunnel junction of the selected thermally assisted switching magnetic random access memory cell.

14. The method according to claim 13, wherein the word read bias voltage is such that the select transistor is operated in its linear region.

15. The method according to claim 13, wherein the sense voltage is 300 mV.

* * * * *